United States Patent
Wakisaka et al.

(10) Patent No.: US 7,042,081 B2
(45) Date of Patent: May 9, 2006

(54) SEMICONDUCTOR DEVICE HAVING HEAT DISSIPATION LAYER

(75) Inventors: Shinji Wakisaka, Hanno (JP); Hiroyasu Jobetto, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 10/940,232

(22) Filed: Sep. 13, 2004

(65) Prior Publication Data

US 2005/0062147 A1   Mar. 24, 2005

(30) Foreign Application Priority Data

Sep. 19, 2003   (JP) ............................. 2003-328911

(51) Int. Cl.
 *H01L 23/12* (2006.01)
 *H01L 23/34* (2006.01)

(52) U.S. Cl. .............. 257/700; 257/701; 257/702; 257/703; 257/706; 257/707; 257/717; 257/796

(58) Field of Classification Search .......... 257/675, 257/700–703, 705–709, 717, 720, 276, 750, 257/758, 796, E23.101, E21.077, E21.082, 257/E21.084; 361/702, 709, 514
See application file for complete search history.

(56) References Cited

U.S. PATENT DOCUMENTS

| | | | | |
|---|---|---|---|---|
| 5,097,318 A | * | 3/1992 | Tanaka et al. | 257/690 |
| 6,770,971 B1 | * | 8/2004 | Kouno et al. | 257/734 |
| 2002/0030276 A1 | * | 3/2002 | Lu et al. | 257/758 |
| 2005/0098891 A1 | * | 5/2005 | Wakabayashi et al. | 257/758 |

FOREIGN PATENT DOCUMENTS

JP   2001-326299 A   11/2001

* cited by examiner

*Primary Examiner*—Jasmine Clark
(74) *Attorney, Agent, or Firm*—Frishauf, Holtz, Goodman & Chick, P.C.

(57) ABSTRACT

A semiconductor device includes a semiconductor constructing body which has a semiconductor substrate, a plurality of external connection electrodes formed on the semiconductor substrate, and heat dissipation columnar electrodes. Upper interconnections are mounted on one side of the semiconductor constructing body and connected to the external connection electrodes of the semiconductor constructing body. A heat dissipation layer is mounted on one side of the semiconductor constructing body and made of the same material as that of the upper interconnections.

20 Claims, 20 Drawing Sheets

SEMICONDUCTOR DEVICE HAVING HEAT DISSIPATION LAYER

CROSS-REFERENCE TO RELATED APPLICATIONS

This application is based upon and claims the benefit of priority from prior Japanese Patent Application No. 2003-328911, filed Sep. 19, 2003, the entire contents of which are incorporated herein by reference. Japanese Patent Application No. 2004-193124, filed Jun. 30, 2004, is cited hereby, the entire contents of which are incorporated herein by reference.

BACKGROUND OF THE INVENTION

1. Field of the Invention

The present invention relates to a semiconductor device having a heat dissipation layer.

2. Description of the Related Art

Conventionally, semiconductor devices called wafer-level packages (WLPs) have been known, in which bump electrodes for external connection are formed on a wafer, a sealing member is formed around them, and thereafter the wafer is cut into individual semiconductor devices by dicing. In a semiconductor device of this type, a first protective film is formed on the lower surface of a semiconductor substrate which has a plurality of connection pads on the upper surface. A second protective film which has opening portions at portions corresponding to the connection pads of the semiconductor substrate is formed on the upper and side surfaces of the semiconductor substrate. Interconnections are formed on the upper surface of the second protective film and electrically connected to the connection pads of the semiconductor substrate. Columnar electrodes are formed on the upper surfaces of the connection pads of the interconnections. A third protective film is formed on the upper surface of the second protective film including the interconnections around the columnar electrodes (e.g., Jpn. Pat. Appln. KOKAI Publication No. 2001-326299).

In the above-described conventional semiconductor device, the lower, side, and upper surfaces, i.e., all surfaces of the semiconductor substrate are covered with the first to third protective films. For this reason, the protection effect against dust, moisture, and mechanical damage increases. On the other hand, heat generated from the integrated circuit formed on the semiconductor substrate stays in the first to third protective films, resulting in poor heat dissipation effect.

BRIEF SUMMARY OF THE INVENTION

It is therefore an object of the present invention to provide a semiconductor device capable of increasing the heat dissipation effect.

According to an aspect of the present invention, there is provided a semiconductor device comprising: a base plate; a semiconductor constructing body which is formed on the base plate and has a semiconductor substrate and a plurality of external connection electrodes formed on the semiconductor substrate; an electrical insulating layer which is formed on the semiconductor constructing body and on the base plate around the semiconductor constructing body; upper interconnections each of which includes at least one layer and which is connected to the external connection electrode of the semiconductor constructing body on the electrical insulating layer and has a connection pad portion; an upper insulating film which covers thereof the upper interconnections except the connection pad portions; and a heat dissipation layer which is formed on at least one of an upper surface of the upper insulating film and a lower surface of the base plate and connected to the semiconductor constructing body.

According to another aspect of the present invention, there is provided a semiconductor device comprising: a semiconductor substrate having a plurality of connection pads; a protective film which is formed on the semiconductor substrate and has opening portions which expose the connection pads; columnar electrodes which are formed on the protective film and electrically connected to the connection pads; at least one heat dissipation columnar electrode formed on the protective film; a sealing film which is formed between the columnar electrodes and the heat dissipation columnar electrodes; and a heat dissipation layer which is connected to the heat dissipation columnar electrode and formed to cover a portion between the heat dissipation columnar electrodes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
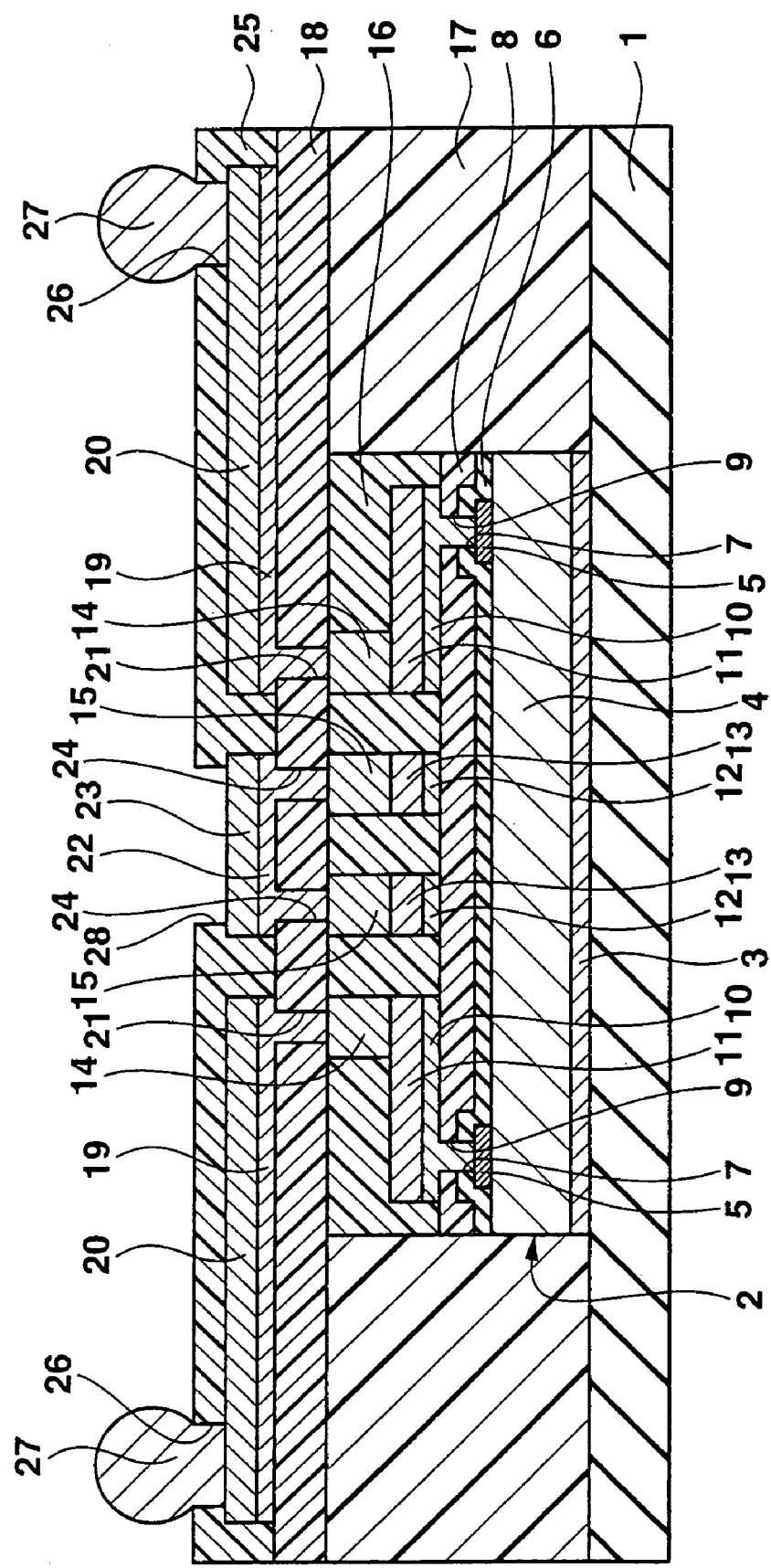
FIG. 1 is an enlarged sectional view of a semiconductor device according to the first embodiment of the present invention.

FIG. 1 is a sectional view of a semiconductor device according to the first embodiment of the present invention. This semiconductor device has a base plate 1 having a rectangular planar shape. The base plate 1 is made of an insulating material prepared by, for example, impregnating glass fibers, aramid fibers, or liquid crystal fibers with epoxy resin, polyimide resin, BT (Bismaleimide Triazine) resin, or PPE (PolyPhenylene Ether). Alternatively, the base plate 1 is made of an insulating material such as silicon, glass, ceramic, or a single resin.

The lower surface of a semiconductor constructing body 2 which has a rectangular planar shape and is slightly smaller than the base plate 1 is bonded to the central portion of the upper surface of the base plate 1 via an adhesive layer 3 made of a die bonding material. In this case, the semiconductor constructing body 2 has interconnections, columnar electrodes, and a sealing film (to be described later) and is generally called a CSP (Chip Size Package). The semiconductor constructing body 2 is also particularly called a wafer-level CSP (W-CSP) because a method of forming the interconnections, columnar electrodes, and sealing film on a silicon wafer and then executing dicing to obtain individual semiconductor constructing bodies 2 is employed, as will be described later. The structure of the semiconductor constructing body 2 will be described below.

The semiconductor constructing body 2 has a silicon substrate (semiconductor substrate) 4. The silicon substrate 4 is bonded to the upper surface of the base plate 1 via the adhesive layer 3. An integrated circuit (not shown) having a predetermined function is formed at the central portion of the upper surface of the silicon substrate 4. A plurality of connection pads 5 are formed at the peripheral portion on the upper surface. The connection pads 5 are made of an aluminum-based metal and connected to the integrated circuit. An insulating film 6 made of silicon oxide is formed on the upper surface of the silicon substrate 4 except the central portion of each connection pad 5. The central portion of each connection pad 5 is exposed through an opening portion 7 formed in the insulating film 6.

A protective film (insulating film) 8 made of epoxy resin or polyimide resin is formed on the upper surface of the insulating film 6. Opening portions 9 are formed in the protective film 8 at positions corresponding to the opening portions 7 of the insulating film 6. An underlying metal layer 10 made of copper extends from the upper surface of each connection pad 5 exposed through the opening portions 7 and 9 to a predetermined portion on the upper surface of the protective film 8. Interconnections 11 made of copper are formed on the entire upper surface of the underlying metal layer 10. A columnar electrode 14 is formed on each interconnection 11 at a portion remote from the opening portion 9.

A plurality of heat dissipation underlying metal layers 12 separated from each other and made of copper are formed at predetermined portions at the central portion of the upper surface of the protective film 8. A heat dissipation interconnection 13 made of copper is formed on the entire upper surface of each heat dissipation underlying metal layer 12. The heat dissipation underlying metal layers 12 and heat dissipation interconnections 13 are not electrically connected to an electric system such as an integrated circuit and are separated from each other. However, these components may electrically and/or mechanically be connected to each other. A heat dissipation columnar electrode 15 is formed on each heat dissipation interconnection 13.

The exposed surfaces of the interconnections 11 are covered with a sealing film 16. The sealing film 16 is arranged around the columnar electrodes 14 and 15 while surrounding them.

As described above, the semiconductor constructing body 2 called a W-CSP includes the silicon substrate 4, connection pads 5, and insulating film 6 and also includes the protective film 8, interconnections 11, heat dissipation interconnections 13, columnar electrodes 14, heat dissipation columnar electrodes 15, and sealing film 16.

An insulating layer 17 having a rectangular frame shape is formed on the upper surface of the base plate 1 around the semiconductor constructing body 2. The upper surface of the insulating layer 17 is almost flush with that of the semiconductor constructing body 2, i.e. the upper surfaces of the columnar electrodes 14 and 15 and sealing film 16. The insulating layer 17 is normally called a prepreg material which is prepared by, e.g., impregnating glass fibers or aramid fibers with a thermosetting resin such as epoxy resin or BT resin.

An upper insulating film 18 having a flat upper surface is formed on the upper surfaces of the semiconductor constructing body 2 and insulating layer 17. The upper insulating film 18 is normally called a build-up material which is used for a build-up substrate. The upper insulating film 18 is made of, e.g., a thermosetting resin such as epoxy resin or BT resin containing a reinforcing material such as a fiber or filler. In this case, the fiber is glass fiber or aramid fiber. The filler is silica filler and ceramic filler.

Upper underlying metal layers 19 made of copper are formed at predetermined portions in a region excluding the central portion of the upper surface of the upper insulating film 18. An upper interconnection 20 made of copper is formed on the entire upper surface of each upper underlying metal layer 19. The upper underlying metal layers 19 including the upper interconnections 20 are connected to the upper surfaces of the columnar electrodes 14 through opening portions 21 formed in the upper insulating film 18 at portions corresponding to the central portions of the upper surfaces of the columnar electrodes 14.

An island-shaped heat dissipation underlying metal layer 22 made of copper is formed at the central portion of the upper surface of the upper insulating film 18. The heat dissipation underlying metal layer 22 is made of the same material as that of the upper underlying metal layer 19 and formed into the same thickness as the upper underlying metal layer 19. A heat dissipation layer 23 made of copper is formed on the entire upper surface of the heat dissipation underlying metal layer 22. The heat dissipation underlying metal layer 22 including the heat dissipation layer 23 is connected to the upper surfaces of the heat dissipation columnar electrodes 15 through opening portions 24 formed in the upper insulating film 18 at portions corresponding to the central portions of the upper surfaces of the heat dissipation columnar electrodes 15. The upper interconnections 20 and heat dissipation layer 23 are made of the same material and formed into the same thickness.

An overcoat film 25 made of solder resist is formed on the upper surfaces of the upper insulating films 18 including the upper interconnections 20 and heat dissipation layer 23. An opening portion 26 is formed in the overcoat film 25 at a portion corresponding to the connection pad portion of each upper interconnection 20. A solder ball 27 is formed in and above each opening portion 26 and connected to the connection pad portion of the upper interconnection 20. The plurality of solder balls 27 are arranged in a matrix in a region except the central portion of the upper surface of the overcoat film 25. An opening portion 28 is formed in the overcoat film 25 at a portion corresponding to the central portion of the heat dissipation layer 23. Hence, the central portion of the heat dissipation layer 23 is exposed outside through the opening portion 28.

As described above, in this semiconductor device, the lower, side, and upper surfaces of the semiconductor constructing body 2 having the silicon substrate 4 are covered with the base plate 1, insulating layer 17, upper insulating film 18, and overcoat film 25. Even in this state, a good heat dissipation effect can be obtained because the heat dissipation layer 23 (including the heat dissipation underlying metal layer 22) connected to the heat dissipation columnar electrodes 15 (including the heat dissipation interconnections 13 and heat dissipation underlying metal layers 12) of the semiconductor constructing body 2 is exposed outside through the opening portion 28 of the overcoat film 25.

As described above, the size of the base plate 1 is larger than that of the semiconductor constructing body 2 to some extent. This is because the layout region of the solder balls 27 should be larger than the size of the semiconductor constructing body 2 to some extent in accordance with the increase in number of connection pads 5 on the silicon substrate 4. Accordingly, the size and pitch of the connection pad portions of the upper interconnections 20 (the portions in the opening portions 26 of the overcoat film 25) can be made larger than those of the columnar electrodes 14.

For this reason, the connection pad portions of the upper interconnections 20 arranged in a matrix are arranged not only on a region corresponding to the semiconductor constructing body 2 but also on a region corresponding to the insulating layer 17 arranged outside the side surface of the semiconductor constructing body 2. That is, of the solder balls 27 arranged in a matrix, at least the solder balls 27 at the outermost positions are arranged around the semiconductor constructing body 2.

Figure 2:
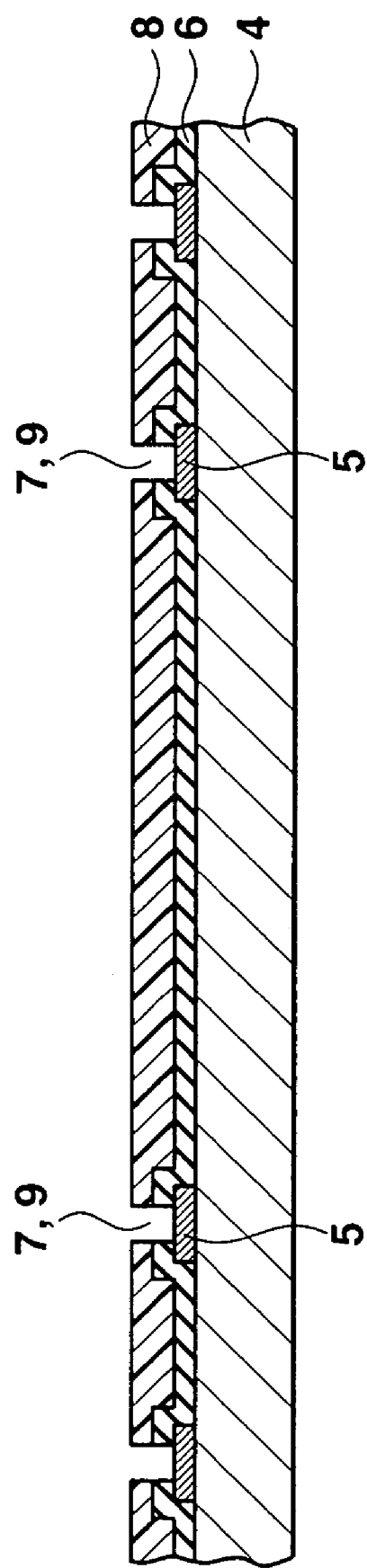
FIG. 2 is an enlarged sectional view showing an initially prepared structure in an example of a method of manufacturing the semiconductor device shown in FIG. 1.

An example of a method of manufacturing the semiconductor device will be described next. First, an example of a method of manufacturing the semiconductor constructing body 2 will be described. In this case, as shown in FIG. 2, a structure is prepared, in which the connection pads 5 made of an aluminum-based metal, the insulating film 6 made of silicon oxide, and the protective film 8 made of epoxy resin or polyimide resin are formed on the silicon substrate 4 in a wafer state, and the central portions of the connection pads 5 are exposed through the opening portions 7 and 9 formed in the insulating film 6 and protective film 8. In the above structure, an integrated circuit having a predetermined function is formed in a region of the silicon substrate 4 in the wafer state, where each semiconductor constructing body should be formed. Each connection pad 5 is electrically connected to the integrated circuit formed in a corresponding region.

Figure 3:
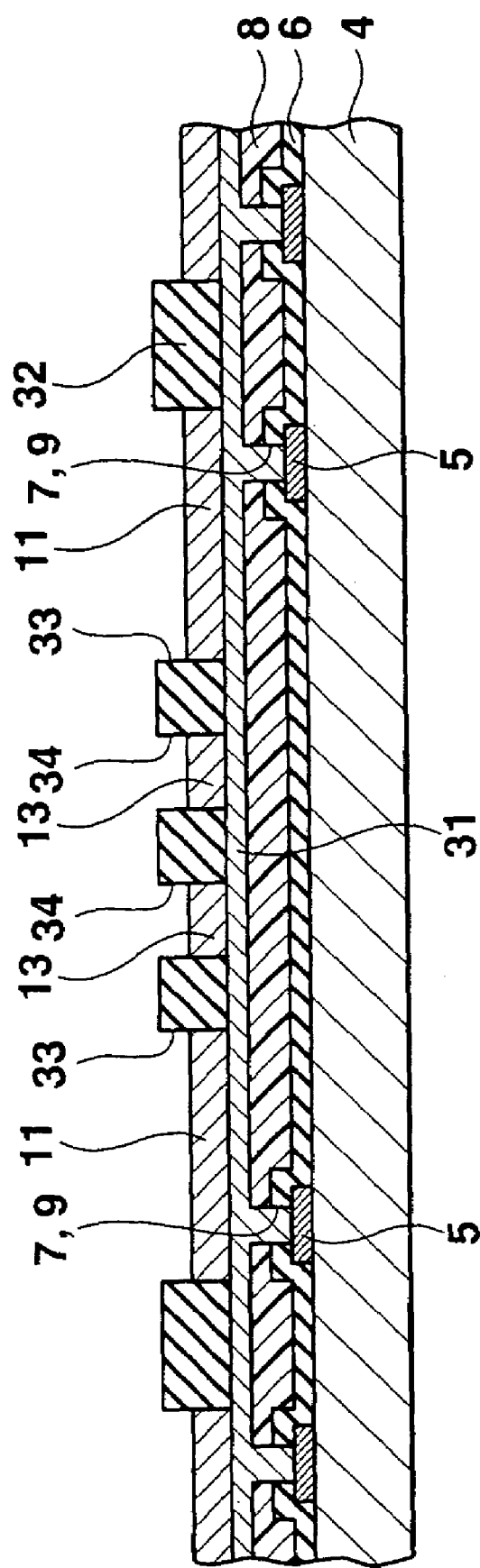
FIG. 3 is an enlarged sectional view showing a step following FIG. 2.

Next, as shown in FIG. 3, the layer 31 for an underlying metal layer is formed on the entire upper surface of the protective film 8, including the upper surfaces of the connection pads 5 exposed through the opening portions 7 and 9. In this case, the layer 31 for an underlying metal layer may have only a copper layer formed by electroless plating or only a copper layer formed by sputtering. Alternatively, a copper layer may be formed by sputtering on a thin titanium layer formed by sputtering. This also applies to a layer 45 for an upper underlying metal layer (to be described later).

Next, a plating resist film 32 is patterned on the upper surface of the layer 31 for an underlying metal layer. In this case, the plating resist film 32 has opening portions 33 and 34 at portions corresponding to the formation regions of the interconnections 11 and the formation regions of the heat dissipation interconnections 13. Copper electroplating is executed using the layer 31 for an underlying metal layer as a plating current path to form the interconnections 11 and heat dissipation interconnections 13 on the upper surfaces of the underlying metal layer 31 in the opening portions 33 and 34 of the plating resist film 32. Then, the plating resist film 32 is removed.

Figure 4:
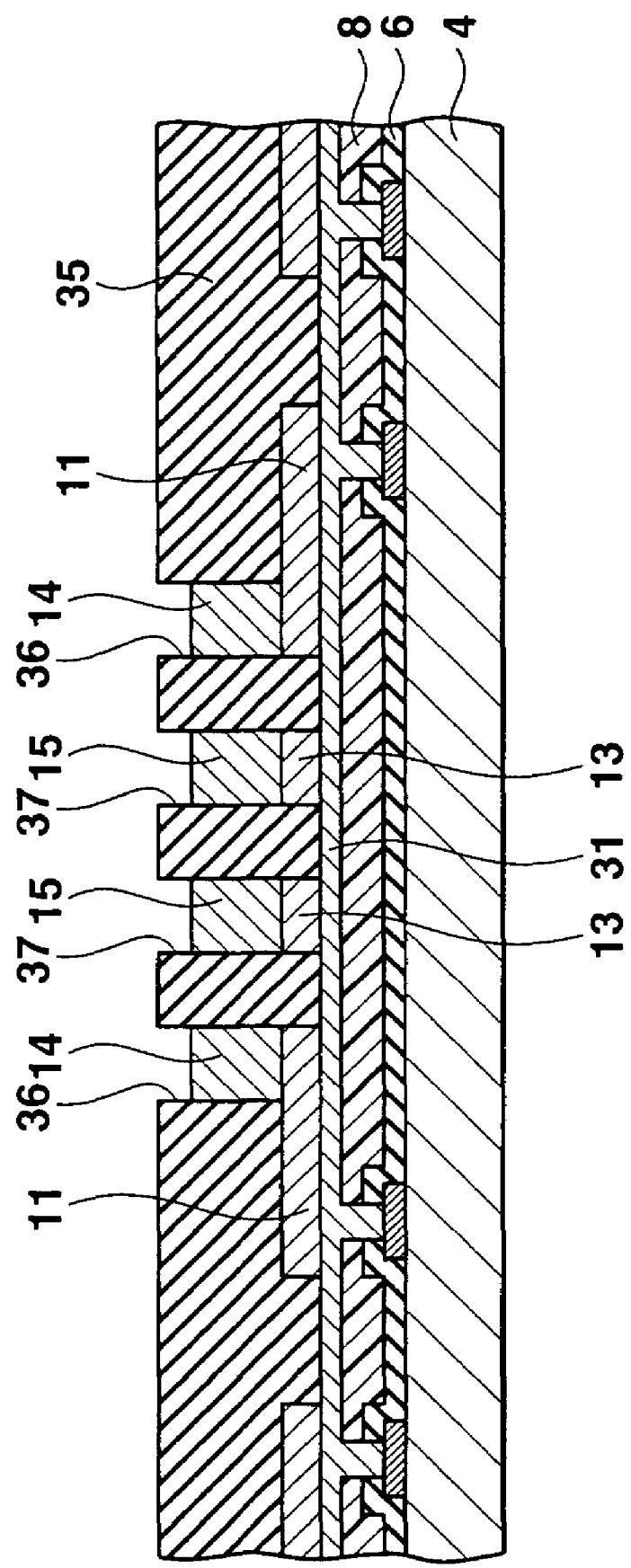
FIG. 4 is an enlarged sectional view showing a step following FIG. 3.

As shown in FIG. 4, a plating resist film 35 is patterned on the upper surface of the layer 31 for an underlying metal layer including the interconnections 11 and heat dissipation interconnections 13. In this case, the plating resist film 35 has opening portions 36 and 37 at portions corresponding to the formation regions of the columnar electrodes 14 and the formation regions of the heat dissipation columnar electrodes 15. Copper electroplating is executed using the layer 31 for an underlying metal layer as a plating current path to form the columnar electrodes 14 and heat dissipation columnar electrodes 15 on the upper surfaces of the connection pad portions of the interconnections 11 and heat dissipation interconnections 13 in the opening portions 36 and 37 of the plating resist film 35.

Figure 5:
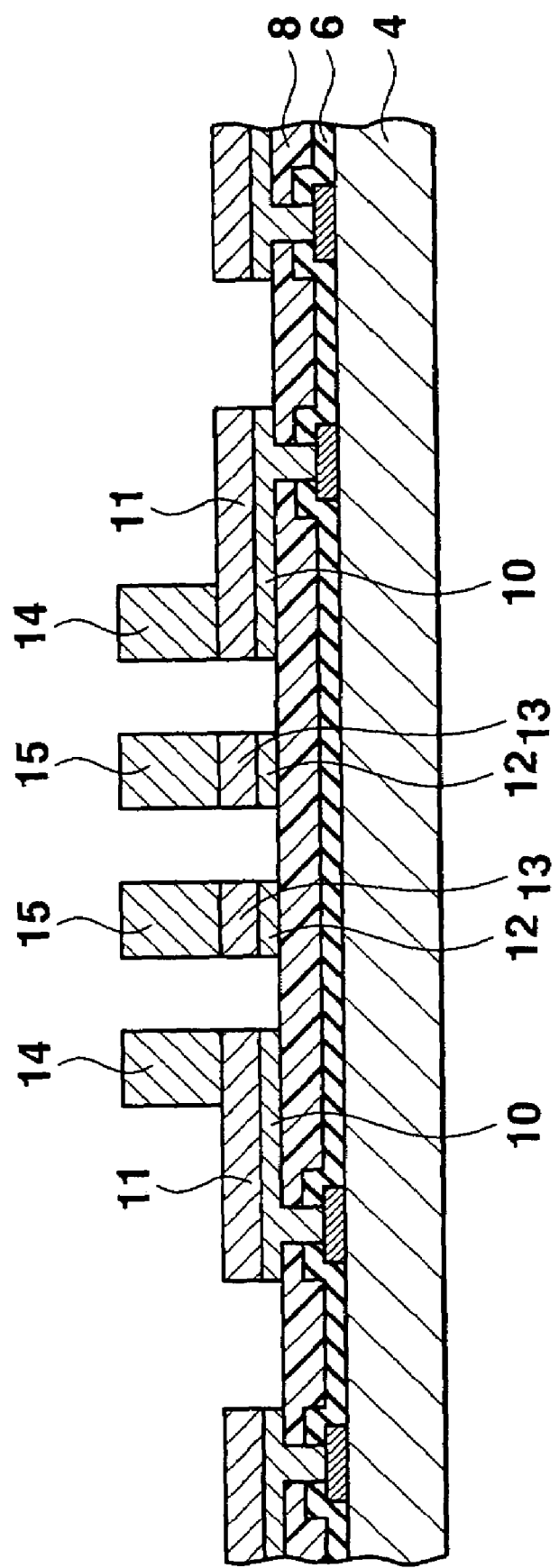
FIG. 5 is an enlarged sectional view showing a step following FIG. 4.

The plating resist film 35 is removed. Unnecessary portions of the layer 31 for an underlying metal layer are removed by etching using the columnar electrodes 14, heat dissipation columnar electrodes 15, interconnections 11, and heat dissipation interconnections 13 as a mask so that the underlying metal layers 10 and heat dissipation underlying metal layers 12 are left only under the interconnections 11 and heat dissipation interconnections 13, as shown in FIG. 5.

Figure 6:
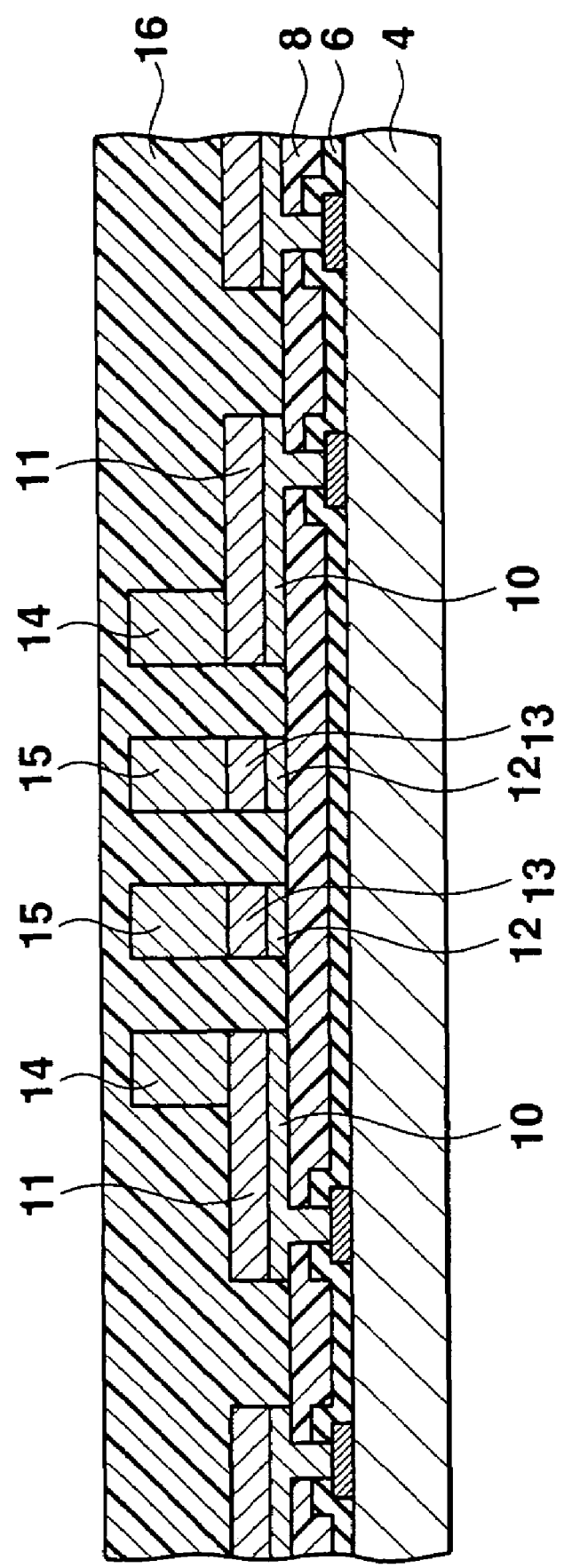
FIG. 6 is an enlarged sectional view showing a step following FIG. 5.

As shown in FIG. 6, the sealing film 16 made of epoxy resin or polyimide resin is formed on the entire upper surface of the protective film 8 including the columnar electrodes 14, heat dissipation columnar electrodes 15, interconnections 11, and heat dissipation interconnections 13 by screen printing, spin coating, or die coating such that the film thickness is more than the height of the columnar electrodes 14 and heat dissipation columnar electrodes 15. Hence, in this state, the upper surfaces of the columnar electrodes 14 and heat dissipation columnar electrodes 15 are covered with the sealing film 16.

Figure 7:
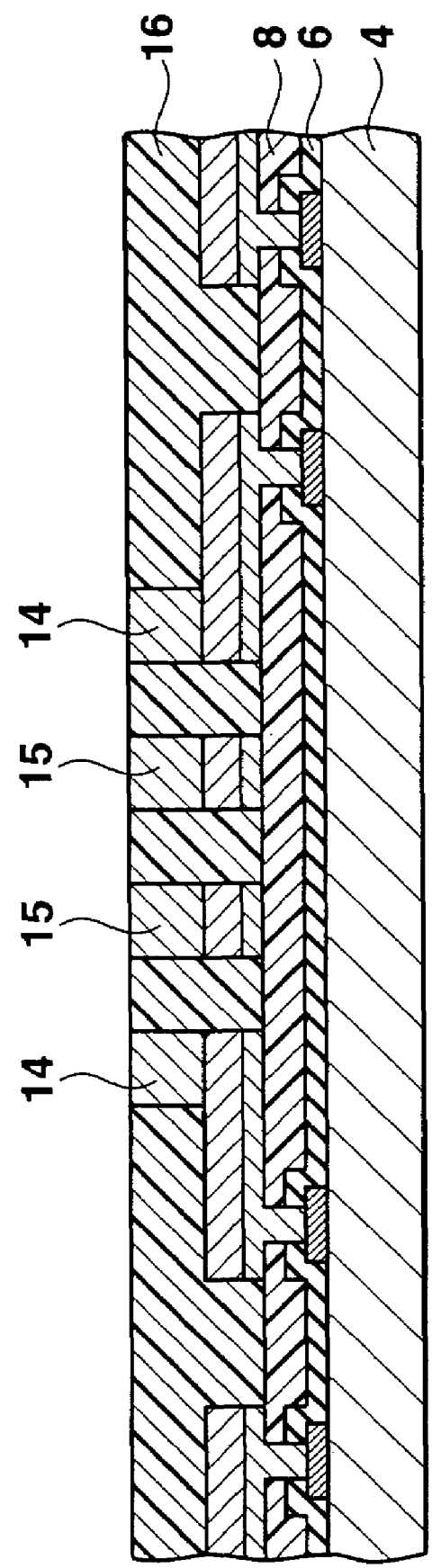
FIG. 7 is an enlarged sectional view showing a step following FIG. 6.

The upper surface side of the sealing film 16, columnar electrodes 14, and heat dissipation columnar electrodes 15 is appropriately polished to expose the upper surfaces of the columnar electrodes 14 and heat dissipation columnar electrodes 15, as shown in FIG. 7. The upper surface of the sealing film 16 including the exposed upper surfaces of the columnar electrodes 14 and heat dissipation columnar electrodes 15 is also planarized. The reason why the upper surface side of the columnar electrodes 14 and heat dissipation columnar electrodes 15 is appropriately polished is that the heights of the columnar electrodes 14 and heat dissipation columnar electrodes 15 formed by electroplating have a variation in its height and need to be uniformed by canceling the variation.

Figure 8:
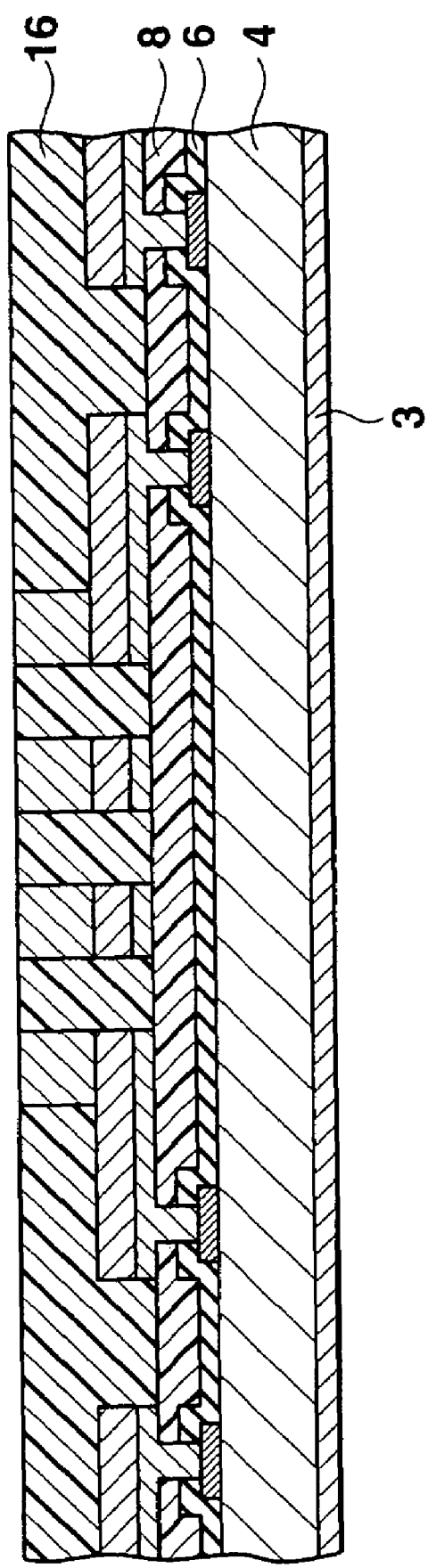
FIG. 8 is an enlarged sectional view showing a step following FIG. 7.
Figure 9:
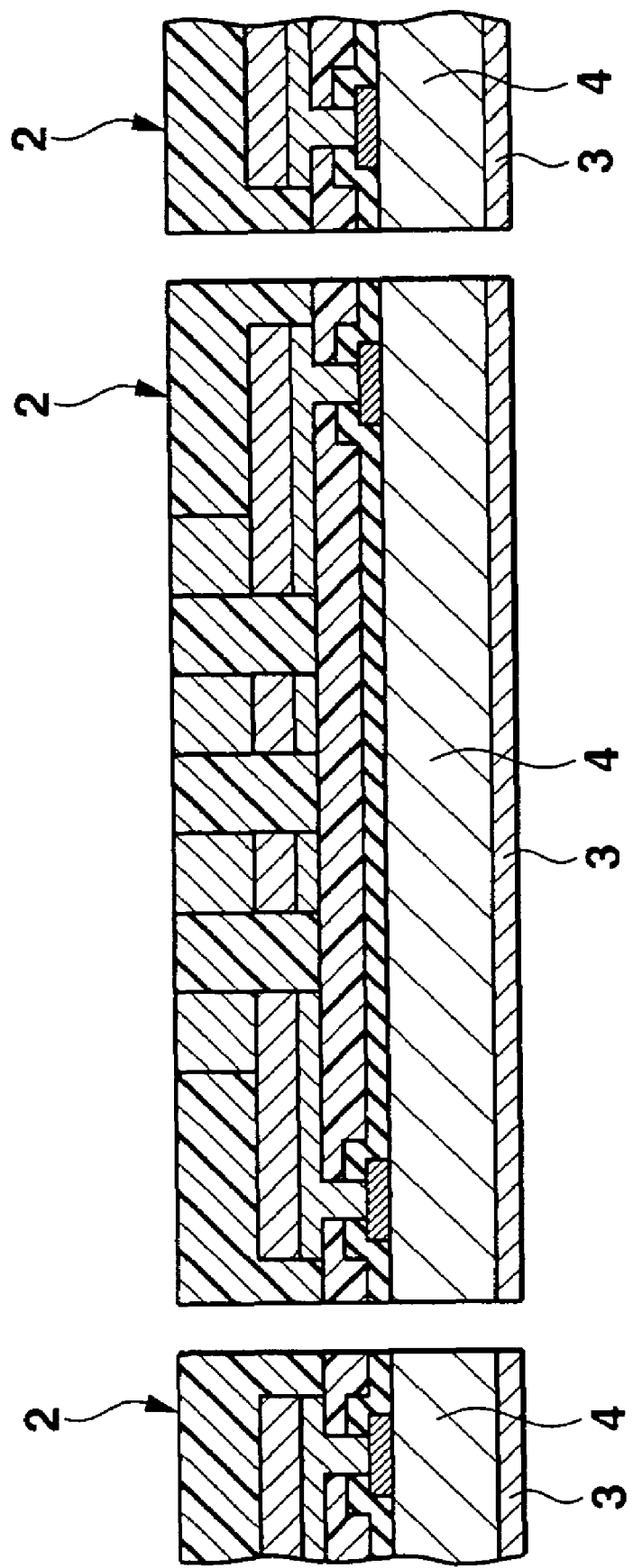
FIG. 9 is an enlarged sectional view showing a step following FIG. 8.

As shown in FIG. 8, the adhesive layer 3 is bonded to the entire lower surface of the silicon substrate 4. The adhesive layer 3 is made of a die bonding material such as epoxy resin or polyimide resin and formed on the silicon substrate 4 in a semi-set state by heating and pressing. Next, the adhesive layer 3 formed on the silicon substrate 4 is bonded to a dicing tape (not shown) and the silicon substrate 4 having columnar electrodes 14 and 15 and the sealing film 16 is subjected to separate into individual semiconductor chips as shown in FIG. 9. After a dicing step, the respective structures are peeled from the dicing tape. Accordingly, a plurality of semiconductor constructing bodies 2 each having the adhesive layer 3 on the lower surface of the silicon substrate 4, as shown in FIG. 1, are obtained.

In the semiconductor constructing body 2 thus obtained, the adhesive layer 3 exists on the lower surface of the silicon substrate 4. Hence, the very cumbersome operation for forming an adhesive layer on the lower surface of the silicon substrate 4 of each semiconductor constructing body 2 after the dicing step is unnecessary. The operation for peeling each semiconductor constructing body from the dicing tape after the dicing step is much simpler than the operation for forming an adhesive layer on the lower surface of the silicon substrate 4 of each semiconductor constructing body 2 after the dicing step.

Figure 10:
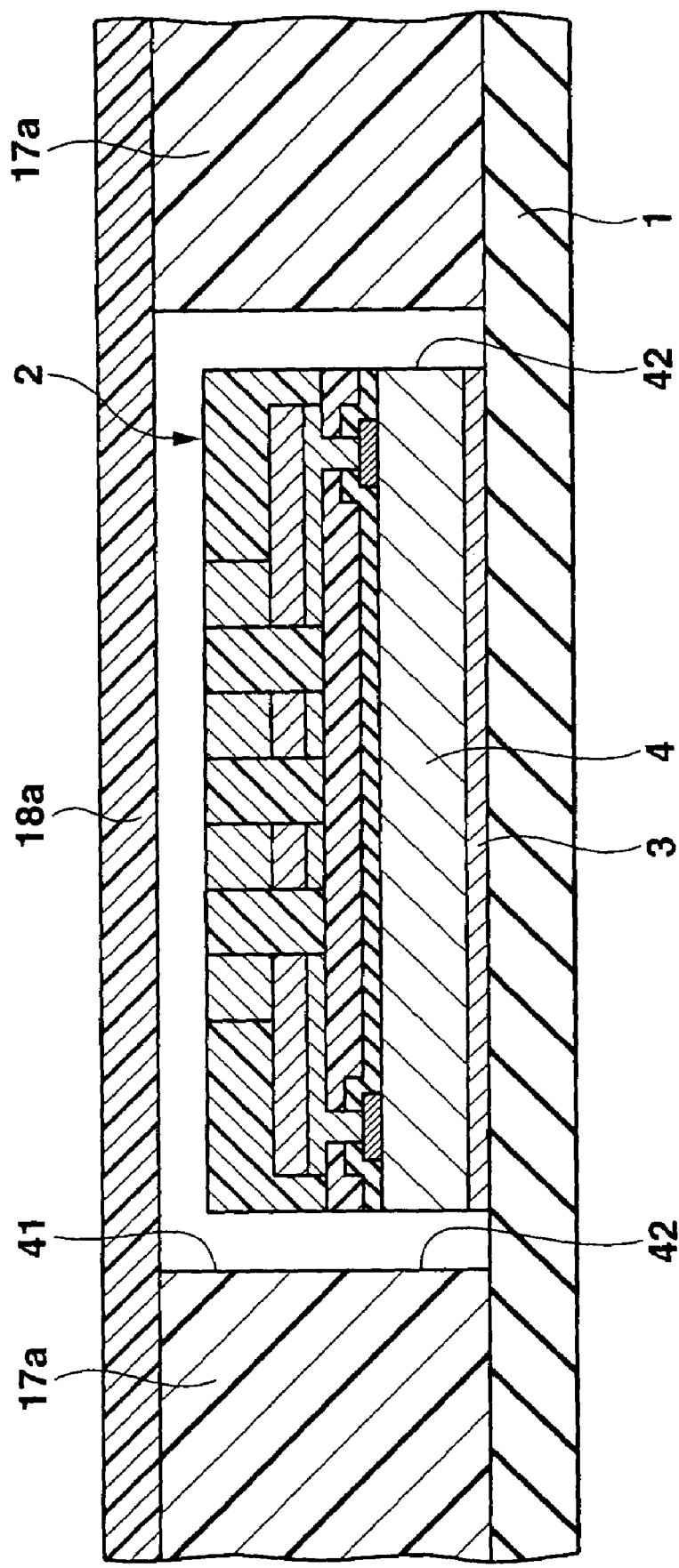
FIG. 10 is an enlarged sectional view showing a step following FIG. 9.

An example will be described next, in which the semiconductor device shown in FIG. 1 is manufactured using the semiconductor constructing body 2 obtained in the above way. First, as shown in FIG. 10, the base plate 1 is prepared. The base plate 1 is so large that a plurality of small base plates 1 shown in FIG. 1 can be sampled. The base plate 1 has a rectangular planar shape, though its shape is not limited. Next, the adhesive layers 3 bonded to the lower surfaces of the silicon substrates 4 of the semiconductor constructing bodies 2 are bonded to a plurality of predetermined portions separated from each other on the upper surface of the base plate 1. In this bonding process, the adhesive layer 3 made of thermosetting resin is finally set by heating and pressing.

Next, a first insulating material 17a having, e.g., a frame sheet having through holes for accommodating the semiconductor constructing bodies 2 in a matrix is positioned on the upper surface of the base plate 1 so as to correspond its frame to portions between the semiconductor constructing bodies 2 and outside those arranged at the outermost positions. A sheet-shaped second insulating material 18a is placed on the upper surface of the first insulating material 17a. The semiconductor constructing bodies 2 may be arranged after the first insulating material 17a is arranged on the base plate 1.

The first insulating material 17a is obtained in the following way. Glass fibers are impregnated with a thermosetting resin such as epoxy resin. The thermosetting resin is semi-set to prepare a sheet-shaped prepreg material. A plurality of rectangular through holes 41 are formed in the prepreg material by die cutting or etching. The semiconductor constructing bodies are arranged in the through holes while being separated from the first insulating material 17a. In this case, the first insulating material 17a preferably has a sheet shape to obtain planarity. However, the first insulating material 17a is not limited to the prepreg material. The first insulating material 17a may be made of a thermosetting resin or a material obtained by dispersing a reinforcing material such as glass fibers or silica fillers in a thermosetting resin.

The sheet-shaped second insulating material 18a is not limited to but is preferably made of a build-up material. As the build-up material, a thermosetting resin such as epoxy resin or BT resin, which is mixed with a silica filler and semi-set, can be used. However, as the second insulating material 18a, the above-described prepreg material or a material containing no filler but only a thermosetting resin may be used.

The size of each through hole 41 in the first insulating material 17a is slightly larger than the size of each semiconductor constructing body 2. For this reason, a gap 42 is formed between the first insulating material 17a and the semiconductor constructing body 2. The size of the gap 42 is, e.g., about 0.2 mm. In addition, the first insulating material 17a is thicker than the semiconductor constructing body 2 so that the gap 42 can sufficiently be filled with the first insulating material when the structure is heated and pressed, as will be described later.

Figure 11:
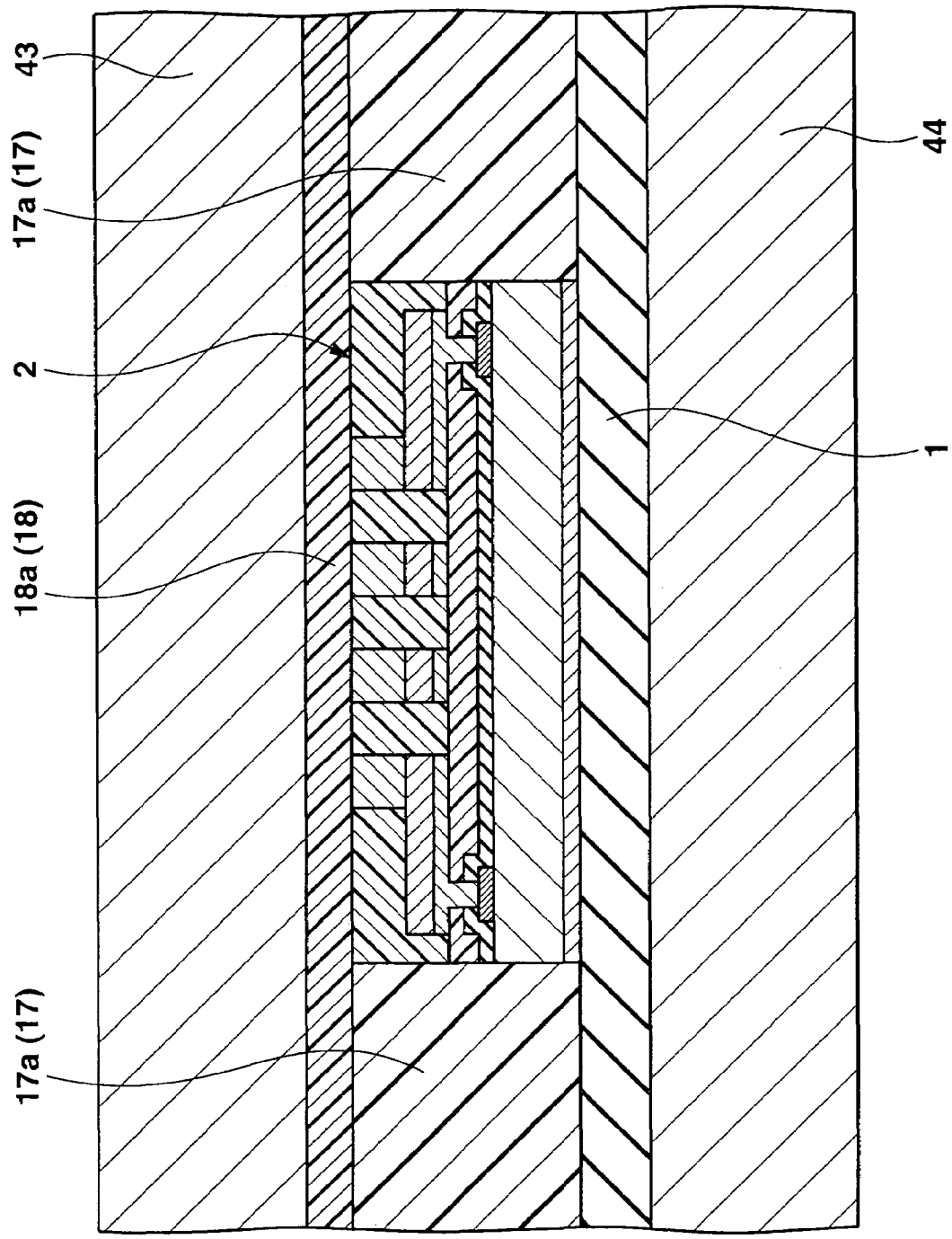
FIG. 11 is an enlarged sectional view showing a step following FIG. 10.

The first and second insulating materials 17a and 18a are heated and pressed by using a pair of heating/pressing plates 43 and 44 having a flat heating/pressing surface shown in FIG. 11. The melted thermosetting resin in the first insulating material 17a is pushed out and fills the gap 42 between the first insulating material 17a and each semiconductor constructing body 2 shown in FIG. 10 and is cured upon cooling while sticking to the semiconductor constructing bodies 2 and the base plate 1 between them. Accordingly, the insulating layer 17 is formed on the upper surface of the base plate 1 between the semiconductor constructing bodies 2 and outside those arranged at the outermost positions, as shown in FIG. 11. The upper insulating film 18 is formed on the upper surfaces of the semiconductor constructing bodies 2 and insulating layer 17.

In this case, the upper surface of the upper insulating film 18 is pressed by the lower surface of the upper heating/pressing plate 43 and therefore becomes flat. Hence, no polishing step is necessary for planarizing the upper surface of the upper insulating film 18. For this reason, even when the base plate 1 is relatively large and has a size of, e.g., 500×500 mm, the upper surface of the upper insulating film 18 for the plurality of semiconductor constructing bodies 2 arranged on the base plate 1 can easily be planarized at once.

Figure 12:
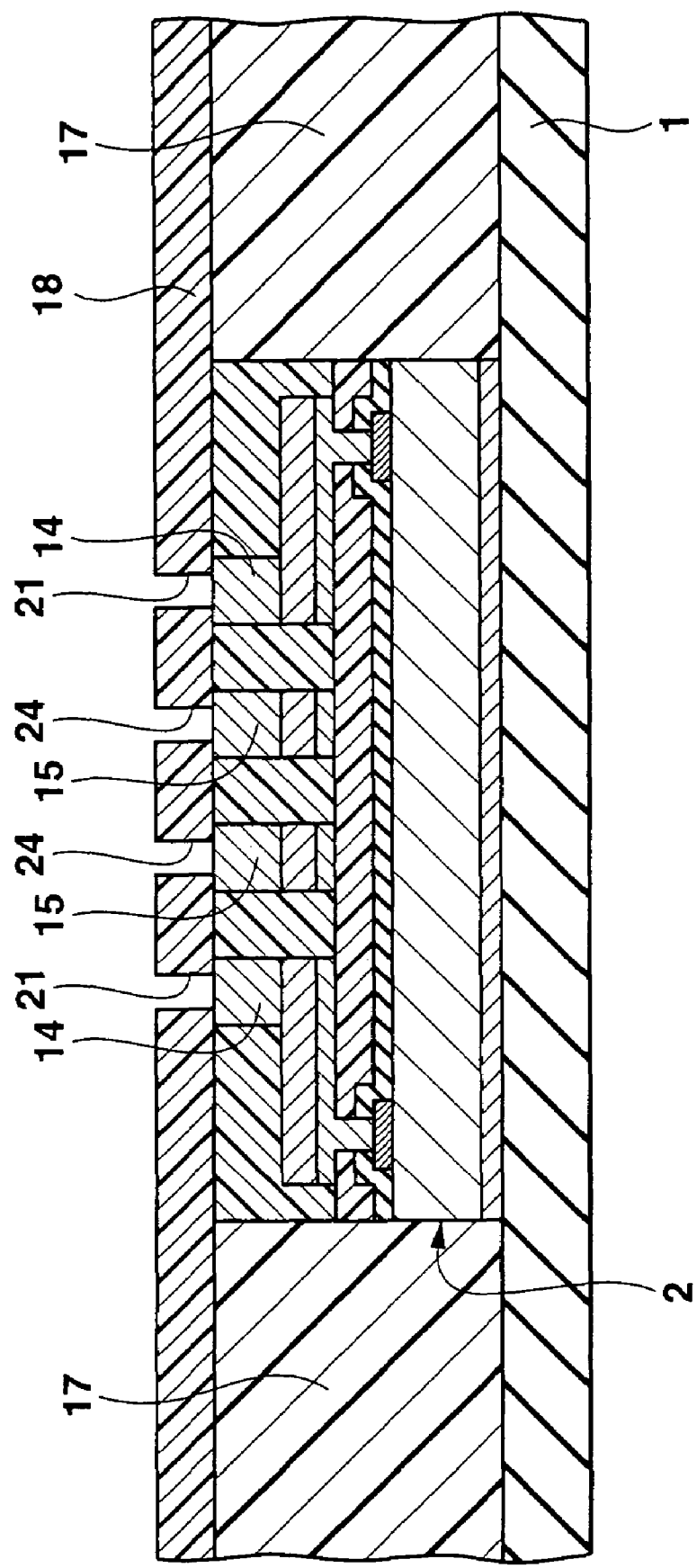
FIG. 12 is an enlarged sectional view showing a step following FIG. 11.

Next, as shown in FIG. 12, the opening portions 21 and 24 are formed in the upper insulating film 18 at portions corresponding to the central portions of the upper surfaces of the columnar electrodes 14 and heat dissipation columnar electrodes 15 by, e.g., laser machining for irradiating the structure with a laser beam. Smears comprising epoxy and generated in the opening portions 21 and 24 are removed by a desmearing process, as needed.

Figure 13:
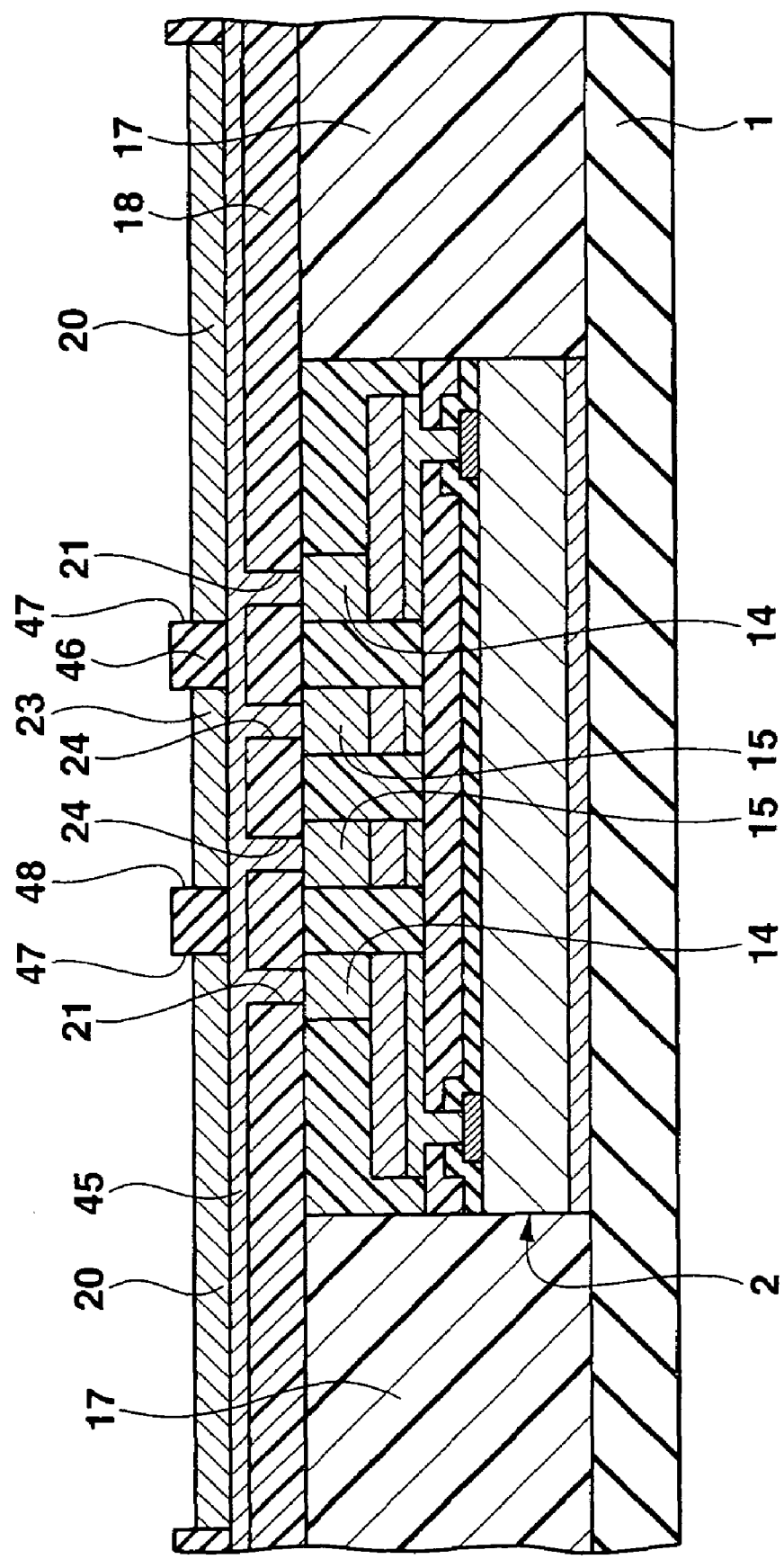
FIG. 13 is an enlarged sectional view showing a step following FIG. 12.

As shown in FIG. 13, the layer 45 for an upper underlying metal layer is formed on the entire upper surface of the upper insulating film 18 including the upper surfaces of the columnar electrodes 14 and heat dissipation columnar electrodes 15 are exposed through the opening portions 21 and 24. A plating resist film 46 is patterned on the upper surface of the layer 45 for an upper underlying metal layer. In this case, opening portions 47 and 48 are formed in the plating resist film 46 at portions corresponding to the formation regions of the upper interconnections 20 and the formation region of the heat dissipation layer 23.

Figure 14:
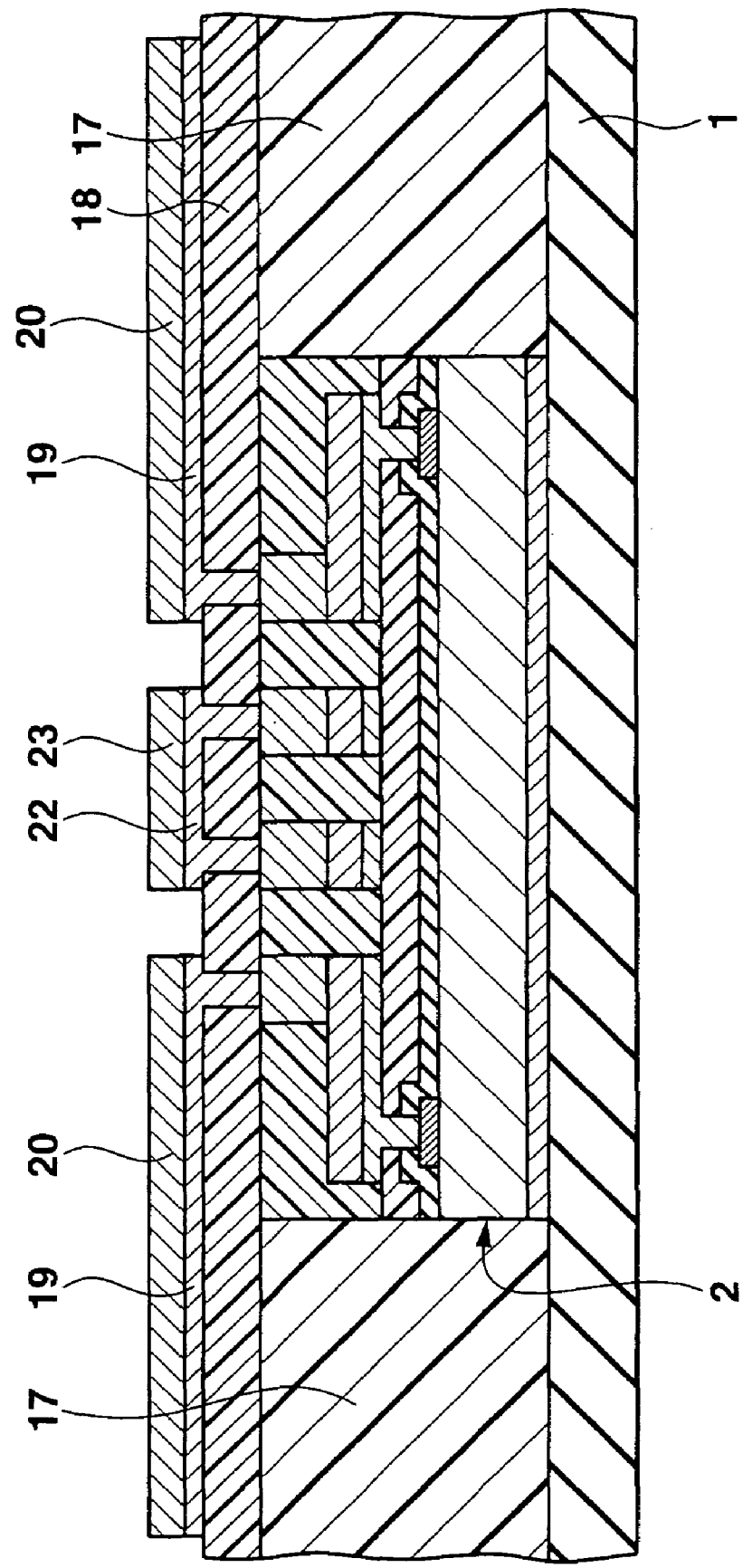
FIG. 14 is an enlarged sectional view showing a step following FIG. 13.

Copper electroplating is executed by using the upper underlying metal layer 45 as a plating current path. Accordingly, the upper interconnections 20 and heat dissipation layer 23 are formed on the upper surfaces of the layer 45 for an upper underlying metal layer in the opening portions 47 and 48 of the plating resist film 46. The plating resist film 46 is removed. Unnecessary portions of the layer 45 for an upper underlying metal layer are removed by etching using the upper interconnections 20 and heat dissipation layer 23 as a mask. As shown in FIG. 14, the upper underlying metal layers 19 and heat dissipation underlying metal layer 22 are left only under the upper interconnections 20 and heat dissipation layer 23.

Figure 15:
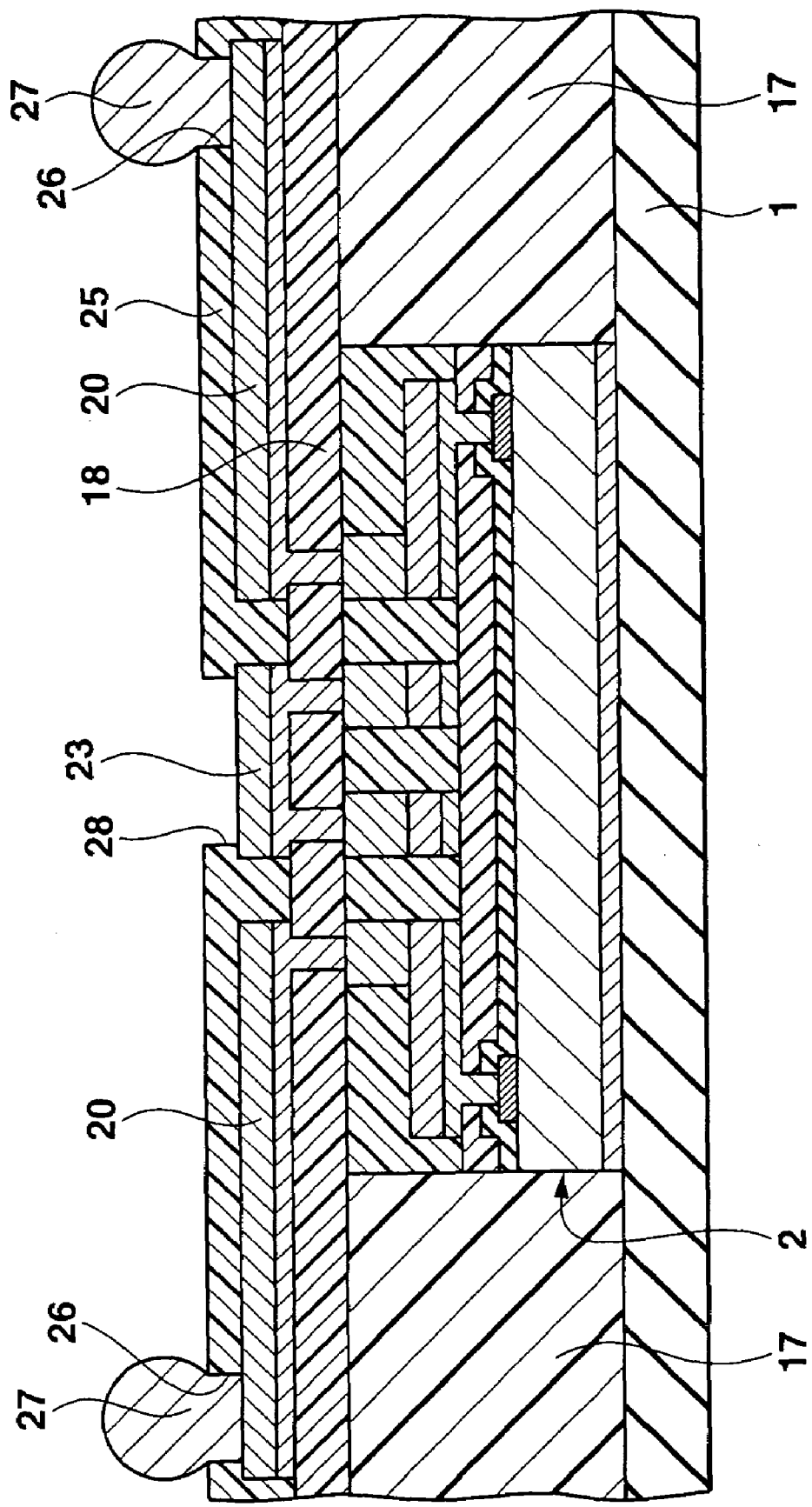
FIG. 15 is an enlarged sectional view showing a step following FIG. 14.

As shown in FIG. 15, the overcoat film 25 made of solder resist is formed on the upper surface of the upper insulating film 18 including the upper interconnections 20 and heat dissipation layer 23 by screen printing or spin coating. In this case, the opening portions 26 are formed in the overcoat film 25 at portions corresponding to the connection pad portions of the upper interconnections 20. In addition, the opening portion 28 is formed in the overcoat film 25 at a portion corresponding to the central portion of the heat dissipation layer 23.

The solder balls 27 are formed in and above the opening portions 26 and connected to the connection pad portions of the upper interconnections 20. When the overcoat film 25, upper insulating film 18, insulating layer 17, and base plate 1 are cut between the adjacent semiconductor constructing bodies 2, a plurality of semiconductor devices shown in FIG. 1 are obtained.

In the above-described manufacturing method, the plurality of semiconductor constructing bodies 2 are arranged on the base plate 1 via the adhesive layer 3. Particularly, the upper interconnections 20, heat dissipation layers 23, and solder balls 27 are formed at once for the plurality of semiconductor constructing bodies 2. Then, the structure is separated to obtain a plurality of semiconductor devices. Hence, the manufacturing step can be simplified. From the manufacturing step shown in FIG. 11, the plurality of semiconductor constructing bodies 2 can be transported together with the base plate 1. This also simplifies the manufacturing step.

Second Embodiment

Figure 16:
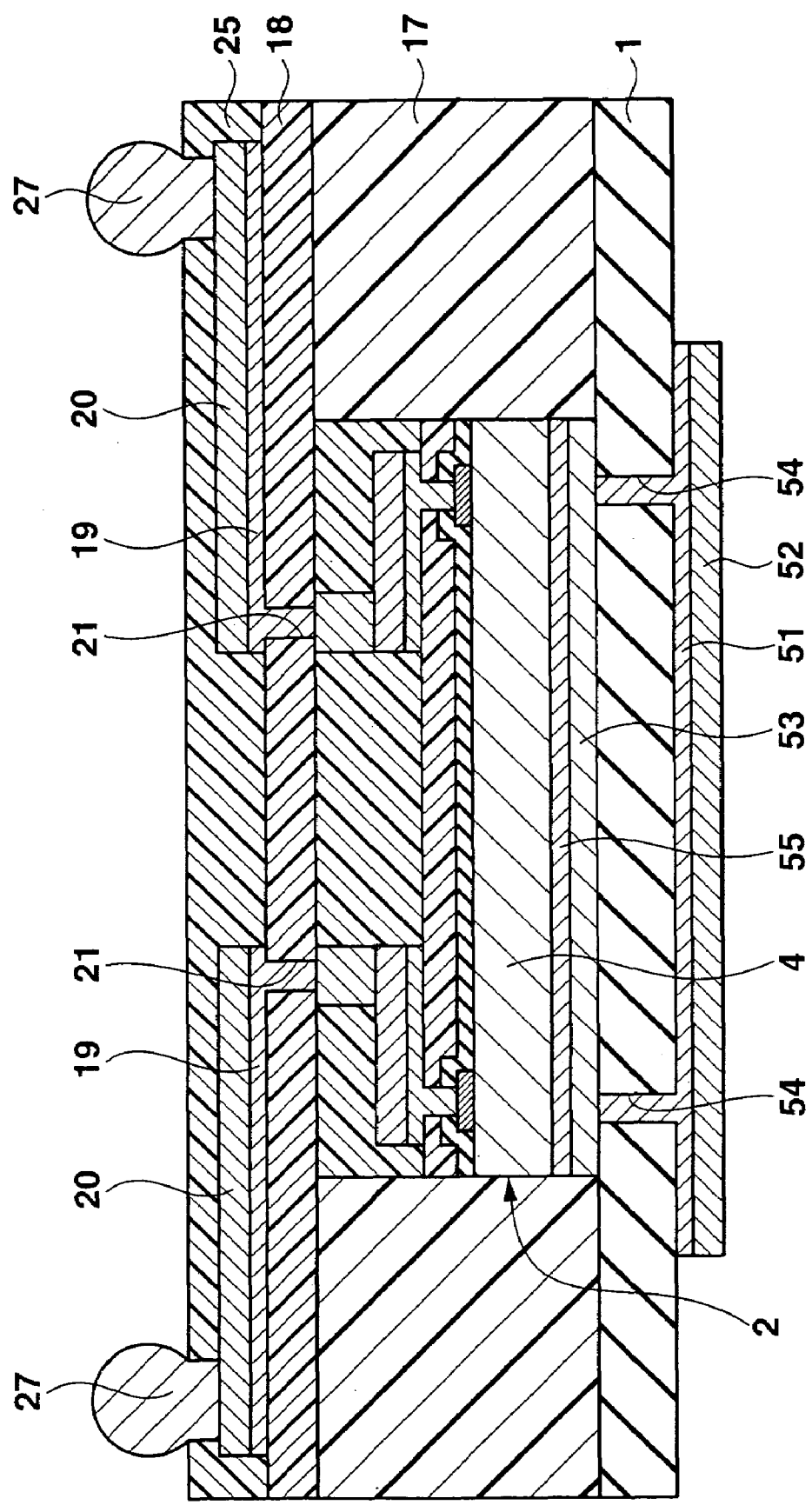
FIG. 16 is an enlarged sectional view of a semiconductor device according to the second embodiment of the present invention.

FIG. 16 is a sectional view of a semiconductor device according to the second embodiment of the present invention. This semiconductor device is different from that shown in FIG. 1 in that the device has none of heat dissipation underlying metal layers 12, heat dissipation interconnections 13, heat dissipation columnar electrodes 15, heat dissipation underlying metal layer 22, heat dissipation layer 23, and opening portion 28. Instead, a heat dissipation underlying metal layer 51 and heat dissipation layer 52 are formed at the central portion of the lower surface of a base plate 1. The heat dissipation underlying metal layer 51 including the heat dissipation layer 52 is connected to a relay heat dissipation layer 53 formed between the base plate 1 and a silicon substrate 4 of a semiconductor constructing body 2 via through holes 54 formed in the base plate 1.

In this case, the relay heat dissipation layer 53 is made of a copper foil and stacked at the central portion of the upper surface of the base plate 1 in advance. The lower surface of the silicon substrate 4 is bonded to the upper surface of the relay heat dissipation layer 53 via a conductive adhesive layer 55 made of a conductive resin or conductive paste. The conductive adhesive layer 55 is used to ensure good heat conduction from the silicon substrate 4 to the relay heat dissipation layer 53. The through holes 54 are formed by laser machining before or after opening portions 21 are formed in an upper insulating film 18. The heat dissipation underlying metal layer 51 and heat dissipation layer 52 are formed simultaneously with formation of upper underlying metal layers 19 and upper interconnections 20.

In this semiconductor device as well, even when the lower, side, and upper surfaces of the semiconductor constructing body 2 having the silicon substrate 4 are covered with the base plate 1, insulating layer 17, upper insulating film 18, and overcoat film 25, a good heat dissipation effect can be obtained because the heat dissipation layer 52 (including the heat dissipation underlying metal layer 51) connected to the silicon substrate 4 of the semiconductor constructing body 2 through the conductive adhesive layer 55 and relay heat dissipation layer 53 is exposed to the lower surface of the base plate 1.

Third Embodiment

Figure 17:
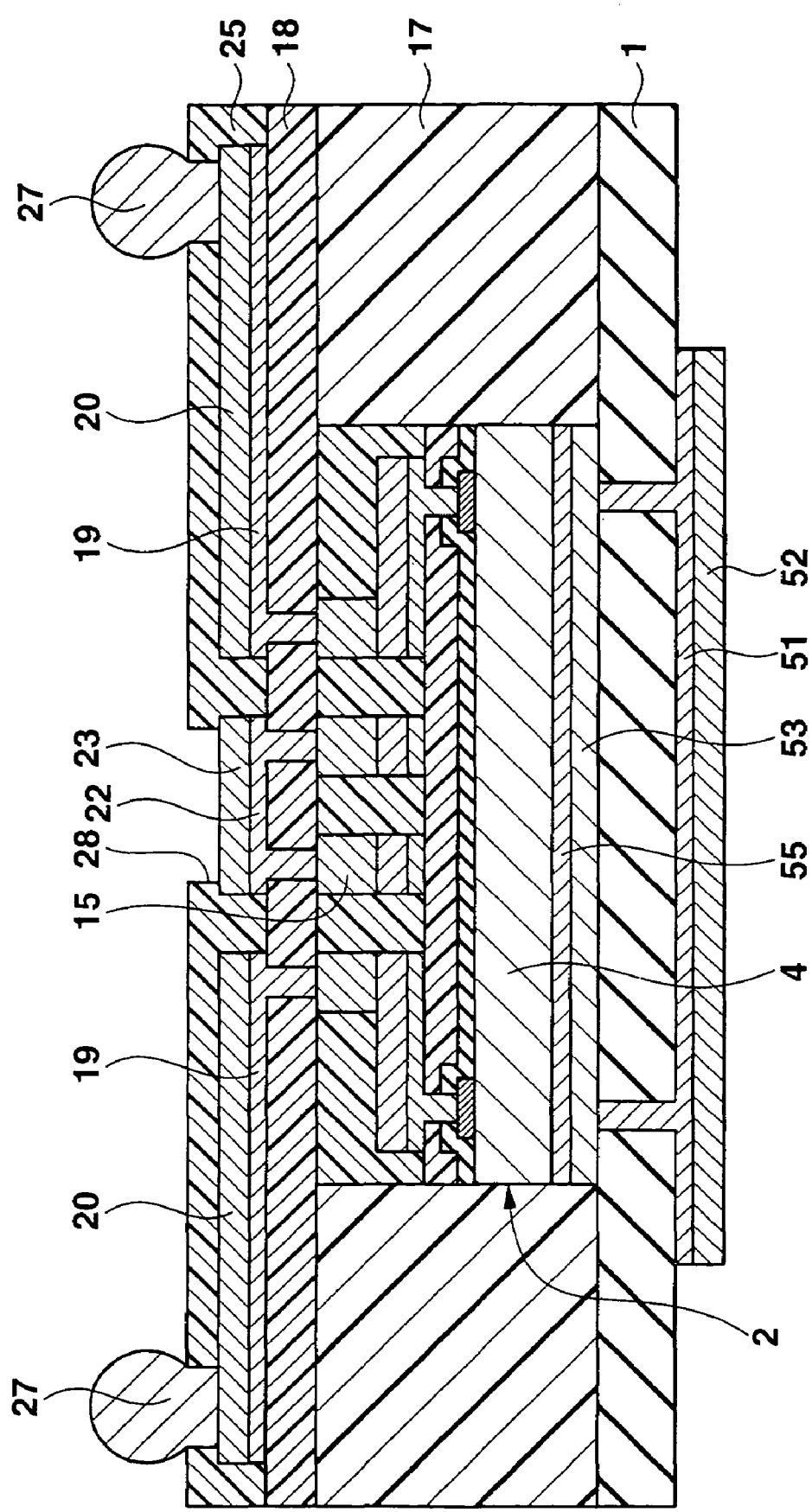
FIG. 17 is an enlarged sectional view of a semiconductor device according to the third embodiment of the present invention.

FIG. 17 is a sectional view of a semiconductor device according to the third embodiment of the present invention. This semiconductor device comprises a heat dissipation layer 23 and the like shown in FIG. 1 and a heat dissipation layer 52 and the like shown in FIG. 16. Hence, in this semiconductor device, the heat dissipation effect can further be increased.

Fourth Embodiment

Figure 18:
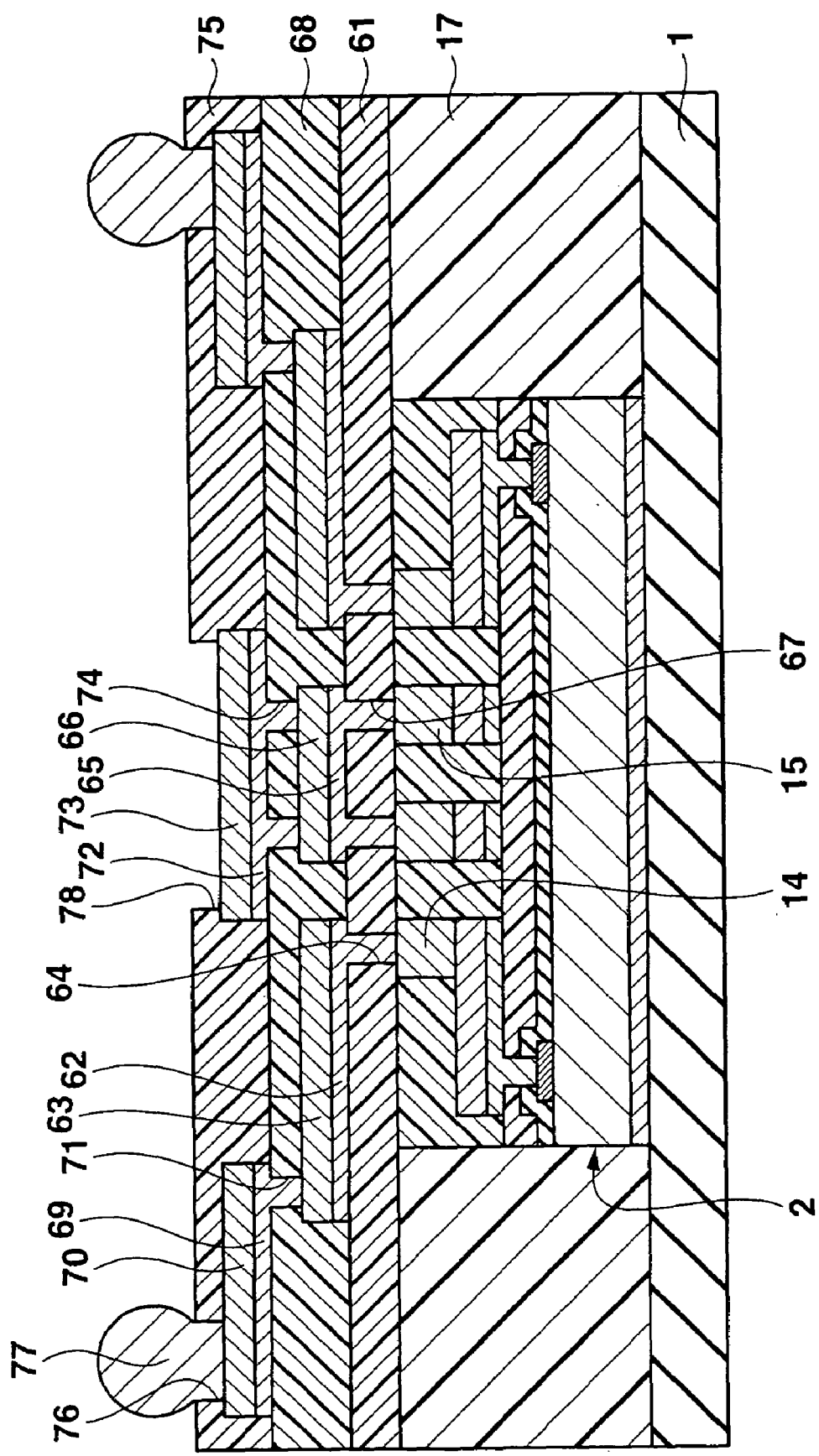
FIG. 18 is an enlarged sectional view of a semiconductor device according to the fourth embodiment of the present invention.

In the first embodiment, as shown in FIG. 1, single-layered upper interconnections 20 are formed on the upper insulating film 18. However, the present invention is not limited to this, and upper interconnections 20 each including two or more layers may be formed. For example, as in the fourth embodiment of the present invention shown in FIG. 18, two layers may be formed. More specifically, a first upper insulating film 61 made a build-up material is formed on the upper surfaces of a semiconductor constructing body 2 and insulating layer 17.

First upper interconnections 63 including first upper underlying metal layers 62 are formed in a region except the central portion of the upper surface of the first upper insulating film 61 and connected to the upper surfaces of columnar electrodes 14 of the semiconductor constructing body 2 through opening portions 64 formed in the first upper insulating film 61. A relay heat dissipation layer 66 including a relay underlying metal layer 65 is formed at the central portion of the upper surface of the first upper insulating film 61 and connected to the upper surfaces of heat dissipation columnar electrodes 15 of the semiconductor constructing body 2 through opening portions 67 formed in the first upper insulating film 61.

A second upper insulating film 68 made of a build-up material is formed on the upper surface of the first upper insulating film 61 including the first upper interconnections 63 and relay heat dissipation layer 66. Second upper interconnections 70 including second underlying metal layers 69 are formed in a region except the central portion of the upper surface of the second upper insulating film 68 and connected to the connection pad portions of the first upper interconnections 63 through opening portions 71 formed in the second upper insulating film 68. A heat dissipation layer 73 including a heat dissipation underlying metal layer 72 is formed at the central portion of the upper surface of the second upper insulating film 68 and connected to the relay heat dissipation layer 66 through opening portions 74 formed in the second upper insulating film 68.

An overcoat film 75 made of solder resist is formed on the upper surface of the second upper insulating film 68 including the second upper interconnections 70 and heat dissipation layer 73. Opening portions 76 are formed in the overcoat film 75 at portions corresponding to the connection pad portions of the second upper interconnections 70. A solder ball 71 is formed in and above each opening portion 76 and connected to the connection pad portion of a corresponding one of the second upper interconnections 70. An opening portion 78 is formed in the overcoat film 75 at a portion corresponding to the central portion of the heat dissipation layer 73. Hence, the central portion of the heat dissipation layer 73 is exposed outside through the opening portion 78.

Fifth Embodiment

Figure 19:
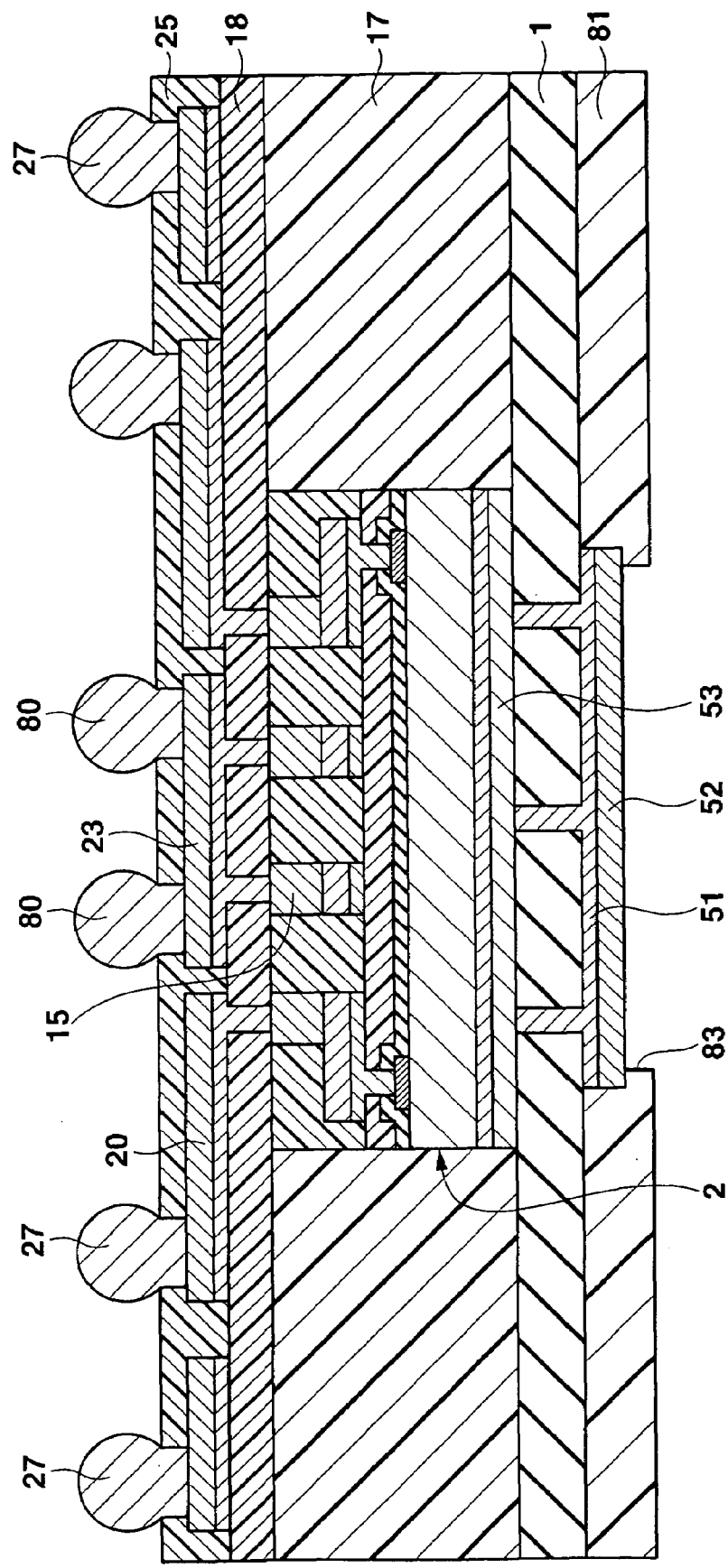
FIG. 19 is an enlarged sectional view of a semiconductor device according to the fifth embodiment of the present invention.

The fifth embodiment shown in FIG. 19 is different from the third embodiment shown in FIG. 17 in the following points.

As the first point, solder balls 80 are also formed on a heat dissipation layer 23. In this case, an overcoat film 25 is formed to cover even the heat dissipation layer 23 except opening portions which have a size convenient for forming the solder balls 80 for heat dissipation. The solder balls 80 for heat dissipation can be jointed to the heat dissipation path of the circuit board or an external heat sink (not shown). Hence, the heat dissipation effect can further be improved. As the second point, an overcoat film 81 is formed on the lower surface of a base plate 1. The overcoat film 81 has an opening portion 83 which exposes a heat dissipation layer 52. As a modification to this embodiment, solder balls for heat dissipation may be formed on the heat dissipation layer 52. That is, the arrangement of the solder balls for heat dissipation can arbitrarily be selected from the arrangement on only the heat dissipation layer 23, the arrangement on only the heat dissipation layer 52, and the arrangement on both the heat dissipation layer 23 and the heat dissipation layer 52.

Sixth Embodiment

Figure 20:
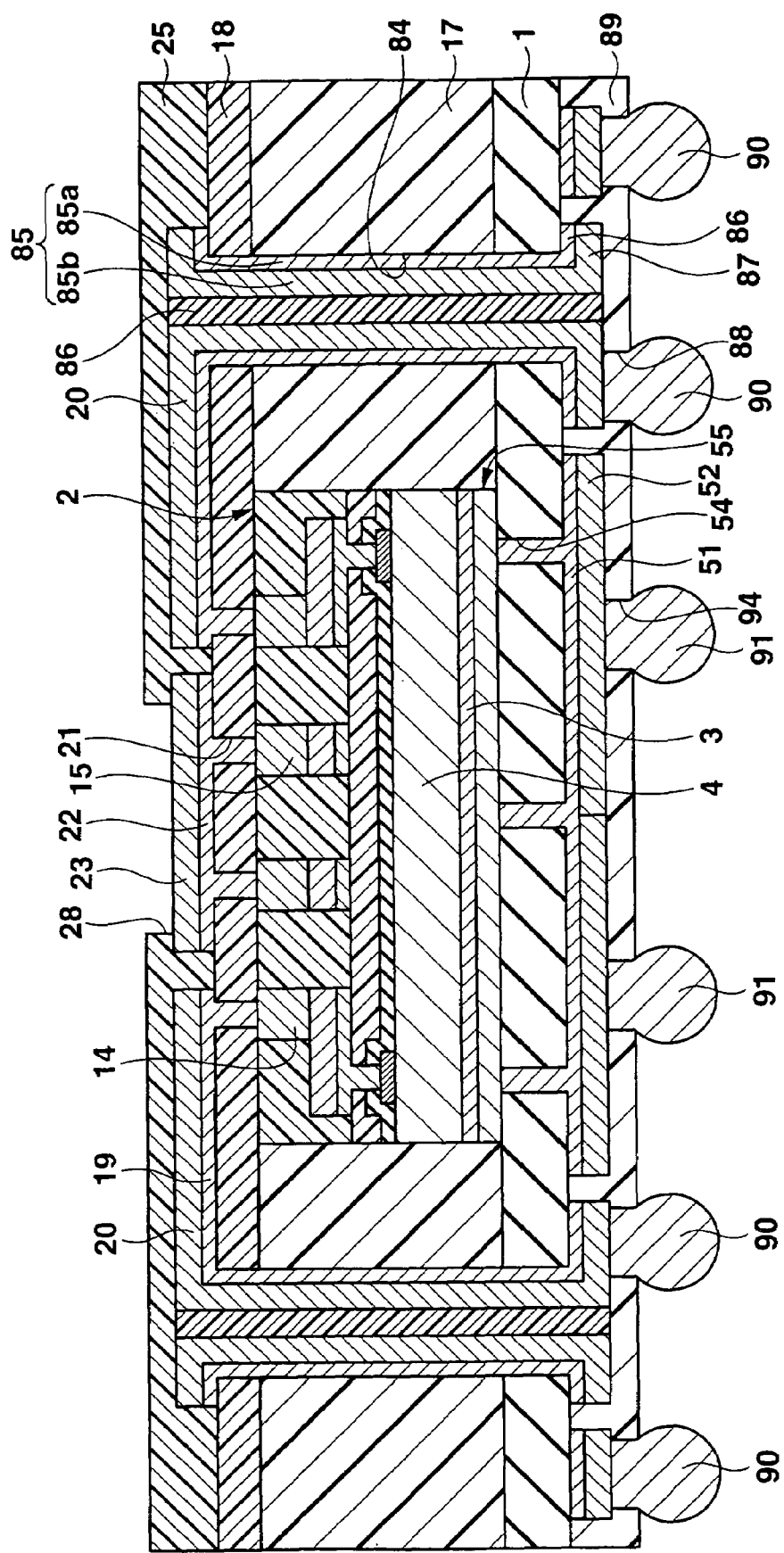
FIG. 20 is an enlarged sectional view of a semiconductor device according to the sixth embodiment of the present invention.

The sixth embodiment shown in FIG. 20 shows an example in which all solder balls are formed not only on the upper interconnection side but on the bottom surface side of a semiconductor constructing body 2. The structure of this embodiment will be described below.

A heat dissipation upper underlying metal layer 22 made of copper is formed all over the central portion of the upper surface of an upper insulating film 18. An upper heat dissipation layer 23 made of copper is formed on the entire upper surface of the heat dissipation upper underlying metal layer 22. The upper heat dissipation layer 23 including the heat dissipation upper underlying metal layer 22 is connected to the upper surfaces of all heat dissipation columnar electrodes 15 through opening portions 21 of the upper insulating film 18.

An upper overcoat film 25 made of solder resist is formed on the upper surface of the upper insulating film 18 including upper interconnections 20 and upper heat dissipation layer 23. An opening portion 28 is formed in the upper overcoat film 25 at a portion corresponding to the central portion of the upper heat dissipation layer 23. Hence, the central portion of the upper heat dissipation layer 23 is exposed outside through the opening portion 28.

A plurality of opening portions 54 are formed at the central portion of a base plate 1. A lower underlying metal layer 86 made of copper is formed in a region except the central portion of the lower surface of the base plate 1. Lower interconnections 87 are formed on the entire lower surface of the lower underlying metal layer 86. A heat dissipation lower underlying metal layer 51 made of copper is formed all over the central portion of the lower surface of the base plate 1. A lower heat dissipation layer 52 is formed on the entire lower surface of the heat dissipation lower underlying metal layer 51. The lower heat dissipation layer 52 including the heat dissipation lower underlying metal layer 51 is connected to an internal heat dissipation layer 55 through the opening portions 54 of the base plate 1.

A lower overcoat film 89 made of solder resist is formed on the lower surface of the base plate 1 including the lower interconnections 87 and lower heat dissipation layer 52. Opening portions 88 are formed in the lower overcoat film 89 at portions corresponding to the connection pad portions of the lower interconnections 87. In addition, opening portions 94 are formed in the lower overcoat film 89 at portions corresponding to a plurality of predetermined portions of the lower heat dissipation layer 52.

Solder balls 90 serving as external connection electrodes are formed in and under the opening portions 88 and connected to the connection pad portions of the lower interconnections 87. Heat dissipation solder balls 91 are formed in and under the opening portions 94 and connected to the lower heat dissipation layer 52. The plurality of solder balls 90 are arranged in a matrix in a region except the central portion under the lower overcoat film 89. The plurality of heat dissipation solder balls 91 are arranged in a matrix at the central portion under the lower overcoat film 89.

Through holes 84 are formed at a plurality of predetermined portions of the upper insulating film 18, insulating layer 17, and base plate 1. A vertical conductive portion 85 including an underlying metal layer 85a and copper layer 85b is formed on the inner wall of each through hole 84. The upper portion of the vertical conductive portion 85 is connected to the upper interconnection 20. The lower portion of the vertical conductive portion 85 is connected to the lower interconnection 87. The interior of the vertical conductive portion 85 is filled with a filler 86 made of solder resist.

The solder balls 90 serving as external connection electrodes are connected to columnar electrodes 14 serving as external connection electrodes adhesive layer 3 through the lower interconnections 87, vertical conductive portions 85, and upper heat dissipation layers 23. The heat dissipation solder balls 91 are thermally connected to the lower surface of the silicon substrate 4 of the semiconductor constructing body 2 through the lower heat dissipation layer 52 (including the heat dissipation lower underlying metal layer 51), the internal heat dissipation layer 55, and the adhesive layer 3.

As described above, in this embodiment, the semiconductor constructing body 2 can be bonded by a face-up method. For this reason, the influence of stress generated by the difference in linear expansion coefficient from the circuit board to be connected can be reduced. In addition, this structure can also be applied to joint of a photosensor having an image sensing element on the upper surface side.

The solder balls may be formed on the upper interconnection side, too. In this case, a plurality of stages of such semiconductor devices may be stacked.

In the above embodiments, the semiconductor constructing body 2 has, as external connection electrodes, the columnar electrodes 14 formed on the connection pad portions of the interconnections 11. However, the present invention is not limited to this. For example, the semiconductor constructing body 2 may have the interconnections 11 having connection pad portions serving as external connection electrodes, the connection pads 5 serving as external connection electrodes, or columnar electrodes formed on the connection pads 5 as external connection electrodes. In the first to fourth embodiments, a single layered circuit including the upper insulating film 18 and upper interconnections 20 on the semiconductor constructing body 2 is formed. However, on the semiconductor constructing body 2, a multi layered circuit including a plurality of layers of the upper insulating films and a plurality of layers of the upper interconnections 20 may be formed. Also, in the first to fourth embodiments, the base plate 1 is one member. However, the base plate 1 may be a multilayered printed circuit board in which insulating films and interconnections are alternately stacked. When a heat dissipation layer should be formed on the base plate 1, preferably, the heat dissipation layer is formed on the lower surface of the lowermost insulating layer, and at least part of the heat dissipation layer is exposed outside. When a heat dissipation layer is formed on the lower surface of the base plate 1, the heat dissipation layer may be exposed, and the lower surface of the base plate may be covered with an overcoat film.

According to the present invention, even when the lower, side, and upper surfaces of a semiconductor constructing body having a semiconductor substrate are covered with a base plate, insulating layer, and upper insulating film, a good heat dissipation effect can be obtained because the heat dissipation layer connected to the semiconductor constructing body is exposed outside.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a base plate;
a semiconductor constructing body which is formed on the base plate and has a semiconductor substrate and a plurality of external connection electrodes formed on the semiconductor substrate;
an electrical insulating layer which is formed on the base plate around the semiconductor constructing body;
an upper insulating film which covers the semiconductor constructing body and the electrical insulating layer;
upper interconnections formed on the upper insulating film and connected to the external connection electrode of the semiconductor constructing body on the electrical insulating layer, each of the upper interconnections having a connection pad portion; and
a heat dissipation layer which is formed on at least one of an upper surface of the upper insulating film and a lower surface of the base plate and connected to the semiconductor constructing body,
wherein the heat dissipation layer is made of the same material as that of the upper interconnections, and
wherein the heat dissipation layer is electrically insulated from the upper interconnection.

2. A device according to claim 1, wherein the semiconductor constructing body has a columnar electrode serving as the external connection electrode.

3. A semiconductor device comprising:
a base plate;
a semiconductor constructing body which is formed on the base plate and has a semiconductor substrate and a plurality of external connection electrodes formed on the semiconductor substrate;
an electrical insulating layer which is formed on the base plate around the semiconductor constructing body;
an upper insulating film which covers the semiconductor constructing body and the electrical insulating layer;
upper interconnections formed on the upper insulating film and connected to the external connection electrode of the semiconductor constructing body on the electrical insulating layer, each of the upper interconnections having a connection pad portion; and
a heat dissipation layer which is formed on at least one of an upper surface of the upper insulating film and a lower surface of the base plate and connected to the semiconductor constructing body,
wherein the semiconductor constructing body has a columnar electrode serving as the external connection electrode; and
wherein the semiconductor constructing body has at least one heat dissipation columnar electrode, and the heat dissipation layer is connected to the heat dissipation columnar electrode.

4. A device according to claim 3, wherein an overcoat film having an opening portion is formed on the upper insulating film and heat dissipation layer while partially exposed through the opening portion of the overcoat film.

5. A device according to claim 4, wherein the heat dissipation layer is made of the same material as that of the upper interconnections.

6. A device according to claim 1, wherein the heat dissipation layer is formed on the lower surface of the base plate.

7. A device according to claim 6, wherein the heat dissipation layer is connected, through a through hole formed in the base plate, to a relay heat dissipation layer formed between the base plate and the semiconductor substrate of the semiconductor constructing body.

8. A device according to claim 7, wherein the relay heat dissipation layer is formed of a metal foil stacked on the base plate.

9. A device according to claim 1, wherein a solder ball is formed on the connection pad portion of each upper interconnection of the uppermost layer.

10. A device according to claim 1, wherein a solder ball is formed on the heat dissipation layer.

11. A device according to claim 1, further comprising a lower interconnection formed on a lower surface side of the base plate, and a vertical conductive member which connects the upper interconnection to the lower interconnection.

12. A semiconductor device comprising:
a semiconductor substrate having a plurality of connection pads;
a protective film which is formed on the semiconductor substrate and has opening portions which expose the connection pads;
columnar electrodes which are formed on the protective film and electrically connected to the connection pads;
heat dissipation columnar electrodes formed on the protective film;
a sealing film which is formed between the columnar electrodes and the heat dissipation columnar electrodes; and a heat dissipation layer which is connected to the heat dissipation columnar electrodes and formed to cover a portion between the heat dissipation columnar electrodes.

13. A device according to claim 12, which further comprises an insulating film which covers the columnar electrodes, the heat dissipation columnar electrodes, and the sealing film, and
in which the heat dissipation layer is formed on the insulating film.

14. A device according to claim 13, wherein the insulating film has opening portions which expose upper surfaces of the columnar electrodes.

15. A device according to claim 14, which further comprises interconnections formed on the insulating film, which are connected to the columnar electrodes through the opening portions.

16. A device according to claim 14, wherein the heat dissipation layer is made of the same material as that of the interconnections.

17. A semiconductor device comprising:
a semiconductor constructing body which has a semiconductor substrate, a plurality of external connection electrodes formed on the semiconductor substrate, and a heat dissipation columnar electrode;
upper interconnections which are mounted on a side of an upper surface of the semiconductor constructing body and connected to the external connection electrodes of the semiconductor constructing body; and
a heat dissipation layer which is mounted on the side of the upper surface of the semiconductor constructing body to be connected to the heat dissipation columnar electrode and made of the same material as that of the upper interconnections.

18. A device according to claim 17, wherein the heat dissipation layer has the same thickness as that of the upper interconnections.

19. A device according to claim 1, wherein the heat dissipation layer has the same thickness as that of the upper interconnections.

20. A semiconductor device comprising:
a base plate;
a semiconductor constructing body which is formed on the base plate and has a semiconductor substrate and a plurality of external connection electrodes formed on the semiconductor substrate;
an electrical insulating layer which is formed on the base plate around the semiconductor constructing body;
an upper insulating film which covers the semiconductor constructing body and the electrical insulating layer;
upper interconnections formed on the upper insulating film and connected to the external connection electrode of the semiconductor constructing body on the electrical insulating layer, each of the upper interconnections having a connection pad portion; and
a heat dissipation layer which is formed on at least a lower surface of the base plate and connected to the semiconductor constructing body,
wherein the heat dissipation layer is made of the same material as that of the upper interconnections.

* * * * *